United States Patent
Lee et al.

(10) Patent No.: US 9,704,568 B1
(45) Date of Patent: Jul. 11, 2017

(54) REDUCING SRAM POWER USING STRATEGIC DATA PATTERN STORAGE

(71) Applicant: International Business Machines Corporation, Armonk, NY (US)

(72) Inventors: Michael J. Lee, Austin, TX (US); Geoffrey Wang, Endicott, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/256,396

(22) Filed: Sep. 2, 2016

(51) Int. Cl.
 *G11C 11/00* (2006.01)
 *G11C 11/419* (2006.01)

(52) U.S. Cl.
 CPC .................. *G11C 11/419* (2013.01)

(58) Field of Classification Search
 CPC ...... G11C 11/412; G11C 11/413; G11C 11/41
 USPC ................................. 365/154, 156
 See application file for complete search history.

(56) References Cited

U.S. PATENT DOCUMENTS

| 4,106,105 | A | 8/1978 | Pross, Jr. |
| 6,901,024 | B2 | 5/2005 | Lee et al. |
| 7,307,905 | B2 | 12/2007 | Najm et al. |
| 7,369,449 | B2 | 5/2008 | Tsunetou |
| 7,468,929 | B2 | 12/2008 | Lee et al. |
| 7,613,052 | B2 | 11/2009 | Van Winkelhoff et al. |
| 8,958,236 | B2 | 2/2015 | Wuu et al. |
| 9,047,981 | B2 | 6/2015 | Hegde et al. |
| 2014/0071743 | A1* | 3/2014 | Kim .................... G11C 11/1675 365/158 |
| 2015/0179269 | A1 | 6/2015 | Lee |

FOREIGN PATENT DOCUMENTS

| JP | 2003030996 A | 1/2003 |
| TW | 473714 | 1/2002 |

OTHER PUBLICATIONS

Chang et al., "Zero-Aware Asymmetric SRAM Cell for Reducing Cache Power in Writing Zero," IEEE Transactions on Very Large Scale Integration (VLSI) Systems, vol. 12, No. 8, Aug. 2004, pp. 827-836.

\* cited by examiner

*Primary Examiner* — Huan Hoang
(74) *Attorney, Agent, or Firm* — Patterson + Sheridan, LLP

(57) ABSTRACT

Embodiments herein describe a SRAM that selectively flips received chunks of data from a high power state to a low power state before storing the chunks of data. The SRAM generates a flip bit for each of the data chunks stored in memory. The state of the flip bit varies depending on whether the corresponding data chunk was flipped before being stored in the SRAM. In one embodiment, the SRAM flips the bits in a data chunk before storing the bits only if all the bits are in the high power state. If so, the SRAM sets the flip bit for the data chunk to a first state and changes all the bits to the low power state before storing the data chunk. If not, the SRAM sets the flip bit to a second state and stores the data chunk without changing the states of the bits.

20 Claims, 5 Drawing Sheets

US 9,704,568 B1

REDUCING SRAM POWER USING STRATEGIC DATA PATTERN STORAGE

BACKGROUND

The present invention relates to a static random-access memory (SRAM), and more specifically, to saving data in a low power state in the SRAM, such that the subsequent reading of the saved data results in reduced dissipation of dynamic power.

In SRAM, one major component of overall dynamic power consumption is the read operation in which a majority of the read bit lines (which may include local and/or global bit lines) are discharged and precharged during the evaluation and precharge stages of a read cycle. Whether a particular bit line discharges or not depends on the state of the bit array cell being accessed. If the bit array cell being accessed stores a particular value (e.g., a high power state), then the dynamic evaluation results in bit lines being discharged from their precharged states, and then subsequently requiring power to restore them to their precharged states. If, on the other hand, the bit array cell being accessed stores the opposite value (e.g., a low power state), then less power is consumed as there is no switching activity in the dynamic path from the array cell to the readout circuitry.

SUMMARY

One embodiment of the present disclosure is a SRAM that includes a data driver configured to generate a flip bit indicating whether a plurality of bits in a received data chunk are in a high power state and, upon determining the plurality of bits are in the high power state, store the flip bit in the SRAM in a first state and flip the plurality of bits before storing the plurality of bits in the SRAM. The data driver is configured to, upon determining at least one of the plurality of bits is in a low power state, store the flip bit in the SRAM in a second state different from the first state and store the plurality of bits in the SRAM without flipping any of the plurality of bits.

Another embodiment described herein is an integrated circuit that includes a data driver for a SRAM configured to generate a flip bit indicating whether a plurality of bits in a received data chunk are in a high power state and, upon determining the plurality of bits are in the high power state, store the flip bit in the SRAM in a first state and flip the plurality of bits before storing the plurality of bits in the SRAM. The data driver is configured to, upon determining at least one of the plurality of bits is in a low power state, store the flip bit in the SRAM in a second state different from the first state and store the plurality of bits in the SRAM without flipping any of the plurality of bits.

Another embodiment described herein is a method for operating an SRAM that includes generating a first flip bit indicating whether a first plurality of bits in a first received data chunk are in a high power state and, upon determining the first plurality of bits are in the high power state, storing the first flip bit in the SRAM in a first state and flipping the first plurality of bits before storing the first plurality of bits in the SRAM. The method includes generating a second flip bit indicating whether a second plurality of bits in a second received data chunk are in the high power state and, upon determining at least one of the second plurality of bits is in a low power state, storing the second flip bit in the SRAM in a second state different from the first state and storing the second plurality of bits in the SRAM without flipping any of the second plurality of bits.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe a SRAM that selectively flips received chunks of data (i.e., a predefined number of bits) from a high power state to a low power state before storing the chunks of data. The SRAM includes a flip bit array that stores a flip bit for each of the data chunks stored in memory. The state of the flip bit varies depending on whether the corresponding data chunk was flipped before being stored in the SRAM. For example, in one embodiment, the SRAM flips the bits in a data chunk before storing the bits only if all the bits are in the high power state. If so, the SRAM sets the flip bit for the data chunk to a first state and changes all the bits to the low power state before storing the data chunk. If not, the SRAM sets the flip bit to a second state and stores the data chunk without changing the states of the bits.

When reading stored bits that are in the low power state, the circuitry in the SRAM does not discharge the precharged bit lines when sensing the bits. In contrast, for bits stored in the high power state, readout circuitry in the SRAM must change the pre-charge voltage on the bit lines to sense the data. Thus, by selective flipping data chunks into the low power state, the SRAM can save power when reading out the data. Moreover, some embodiments herein use less circuitry than other types of data flipping techniques like flipping data chunks if a majority of the bits are in the high power state which requires more overhead for storing and reading the data chunks.

Figure 1:
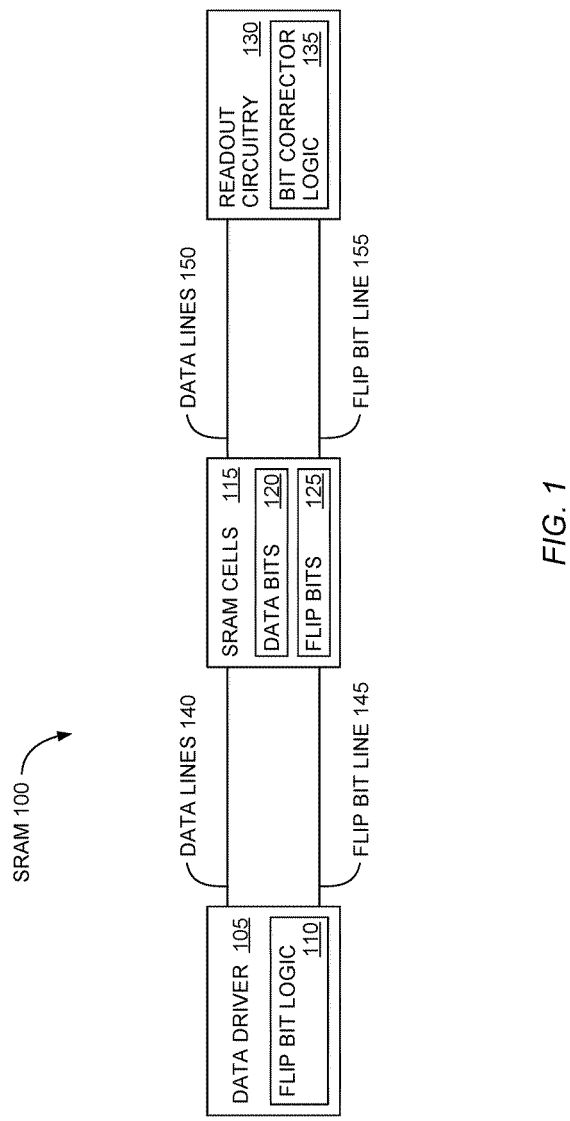
FIG. 1 is a block diagram of a SRAM for flipping data chunks in a high power state, according to one embodiment described herein.

FIG. 1 is a block diagram of a SRAM 100 for flipping data chunks in a high power state, according to one embodiment described herein. In this disclosure it is assumed that the high power state of data stored in the SRAM 100 is a logical one while the low power state of the data is a logical zero; however, the actual value of the high power and low power states may vary depending on the implementation of the SRAM 100. For example, in some SRAM it may require more power to read a logical zero than a logical one stored in the SRAM.

The SRAM 100 includes a data driver 105, SRAM cells 115, and readout circuitry 130. The data driver 105 receives data to be stored in the SRAM cells 115. For example, the data may be contained in a write request received from a processor or memory controller (not shown) in a computing system. The data driver 105 may include a buffer for storing the data until the SRAM 100 can store the data in the SRAM cells 115.

In one embodiment, the data driver 105 evaluates individual data chunks to determine if the bits in the data chunk should be flipped before being stored in the SRAM cells 115. For example, the data driver 105 may receive 64 bits to be stored in the SRAM cells but divide these bits into sixteen individual data chunks that each contains four bits of data. Although the embodiments herein describe a data chunk with a predefined size of four bits, any number of bits can be used. If the predefined size of the data chunks is increased, the overhead required to track the data chunks (i.e., the number of flip bits stored in the SRAM 100) is decreased but the likelihood the data chunks are flipped into the low power state, which saves power, is also decreased. Conversely, as the size of the data chunks is decreased, the likelihood the data chunks are flipped into the power saving state is increased but the overhead required to track the data chunks is also increased—i.e., the SRAM 100 stores more flip bits which means the amount of user data that can be stored in the SRAM 100 is decreased.

The data driver 105 includes flip bit logic 110 which evaluates each of the data chunks and determines whether the bits in the data chunks can be flipped into the low power state. In the embodiments that follow, the flip bit logic 110 flips the bits in the data chunk only if all the bits in the data chunk are in the high power state—logical ones. If not, the flip bit logic 110 leaves the bits in their received states which may include all logical zeros or a mixture of logical ones and zeros.

If the bits in a data chunk are flipped, the flip bit logic 110 outputs a flip bit in a first state (i.e., a flipped state) that corresponds to the data chunk. In one embodiment, the SRAM 100 maintains a flip bit for each data chunk evaluated by the flip bit logic 110. For example, if the SRAM 100 stores a thousand data chunks, the SRAM 100 also stores a thousand flip bits which indicate by their state whether the stored data chunks were flipped before being stored in the SRAM cells 115. If the flip bit logic 110 determines not to flip a data chunk (i.e., the data chunk includes at least one logical zero), the logic 110 outputs a flip bit in a second state (i.e., a un-flipped state) indicating the bits in the corresponding data chunk were stored in the SRAM cells 115 in their original or received states.

In one embodiment, the flipped state of the flip bit corresponds to the high power state—i.e., a logical one— while the un-flipped state of the flip bit corresponds to the lower power state—i.e., a logical zero. Thus, unless the data chunk is flipped, the flip bit logic 110 outputs a flip bit in the low power state—i.e., a logical zero. As described below, because the SRAM 100 reads out the corresponding flip bit each time a data chunk is read out of the SRAM cells 115, storing the flip bit as a logical zero if the data chunk was not flipped means less power is consumed by reading out the flip bit. Put differently, because in some embodiments the most likely scenario is that the data chunks are not flipped before being stored, the flip bit logic 110 outputs a flip bit where the low power state corresponds to when the bits in the data chunk are stored in their original received states.

The data driver 105 transmits the data chunks (whether flipped or un-flipped) to the SRAM cells 115 using the data lines 140 where the SRAM cells 115 stores the data chunks as data bits 120. The data driver 105 transmits the flip bits (whether in the flipped or un-flipped state) using the flip bit line 145 to the SRAM cells 115. In one embodiment, the data lines 140 and flip bit line 145 include global and local bit lines coupled to the SRAM cells 115.

The SRAM cells 115 store the data bits 120 of the data chunks and the flips bits 125. When requested, the readout circuitry 130 performs a read operation to read the data bits 120 and flip bits 125 from the cells 115. For example, the SRAM 100 may receive a request from a processor to retrieve data bits 120 stored in a particular location or address in the SRAM cells 115. When performing the read operation, the readout circuitry 130 pre-charges data lines 150 and a flip bit line 155 (e.g., bit lines). In one embodiment, the readout circuitry 130 pre-charges both local and global bit lines in order to read out the requested data chunks and corresponding flip bits.

If the data bits 120 or flip bits 125 being read out from the SRAM cells are logical ones (i.e., the high power state), the data lines 150 and flip bit line 155 are discharged from their pre-charge voltage. Thus, to use the same lines to read out different data, the readout circuitry 130 has to again use power to drive the bit lines to the pre-charge voltage. Put differently, the same bit lines may be used to access different SRAM cells 115. As such, if a bit line is discharged from the pre-charge voltage when reading from a first memory location, the readout circuitry again must charge the bit line to the pre-charge voltage when reading from a second memory location coupled to the bit line. In contrast, if the bits being read out are zero, then the bit lines remain at the pre-charge voltage. Thus, when using the same bit lines to read zeros from different memory locations, the readout circuitry 130 does not need to re-charge the bit lines (or the amount the bit lines are recharged is at least less than when reading out logical ones).

The readout circuitry 130 includes bit corrector logic 135 which determines whether to flip a data chunk received from the SRAM cells 115 based on the state of the corresponding flip bit also received from the SRAM cells 115. That is, if the flip bit is in the un-flipped state, the bit corrector logic 135 does not flip the data chunk before outputting the data chunk to a requesting entity (e.g., a processor or memory controller). However, if the flip bit is in the flipped state, the logic 135 flips each bit of the data chunk before outputting the data chunk.

In one embodiment, the data driver 105, SRAM cells 115, and readout circuitry 130 are disposed on one or more integrated circuits. In one embodiment, the data driver 105, SRAM cells 115, and readout circuitry 130 are disposed on the same integrated circuit. In another embodiment, the data driver 105, SRAM cells 115, and readout circuitry 130 are disposed on respective integrated circuits.

Figure 2:
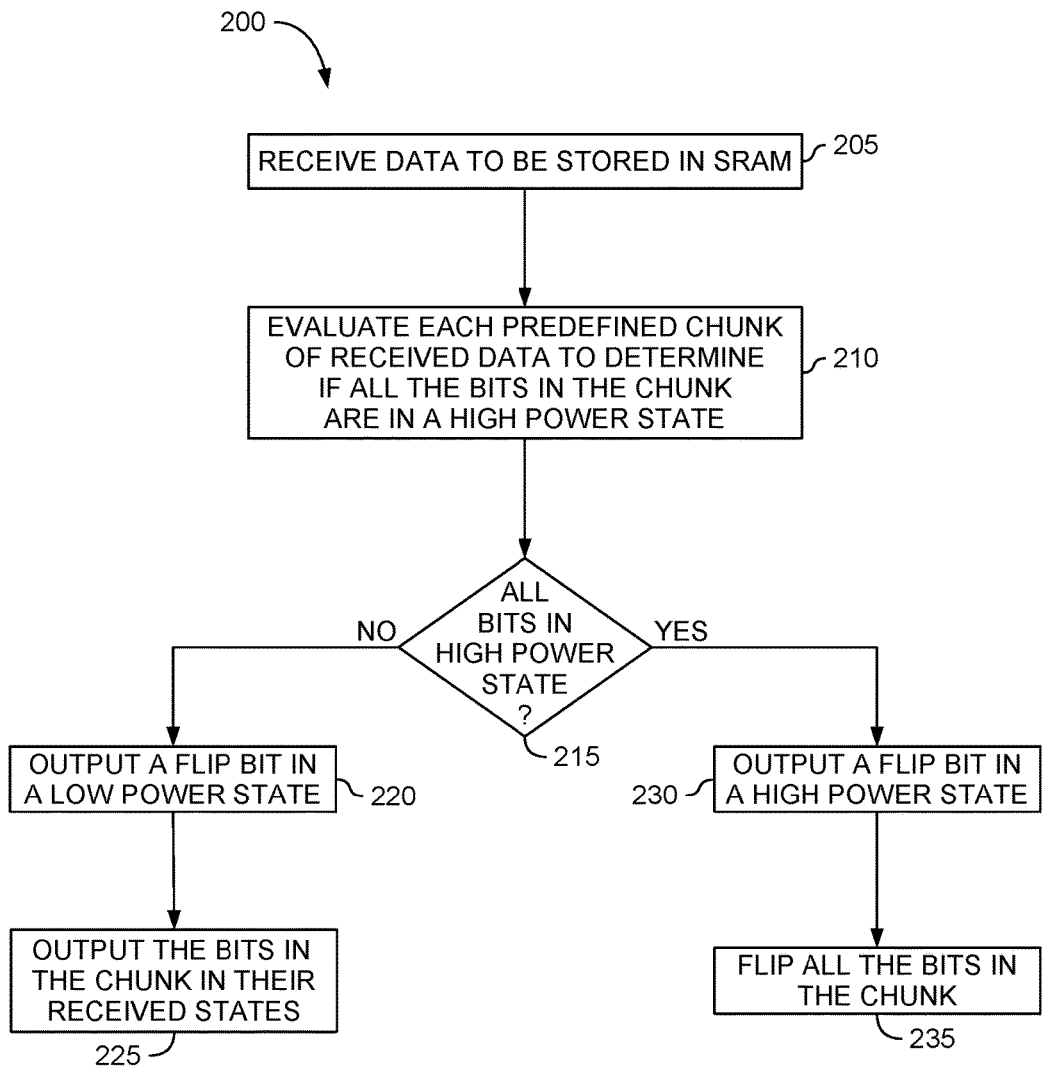
FIG. 2 is a flowchart for determining whether to flip a data chunk to be stored in a SRAM, according to one embodiment described herein.

FIG. 2 is a flowchart of a method 200 for determining whether to flip a data chunk to be stored in a SRAM, according to one embodiment described herein. For clarity, the different blocks of method 200 are described in parallel with FIG. 3 which illustrates a circuit of the data driver 105 for selectively flipping a received data chunk in a SRAM, according to one embodiment described herein.

Figure 3:
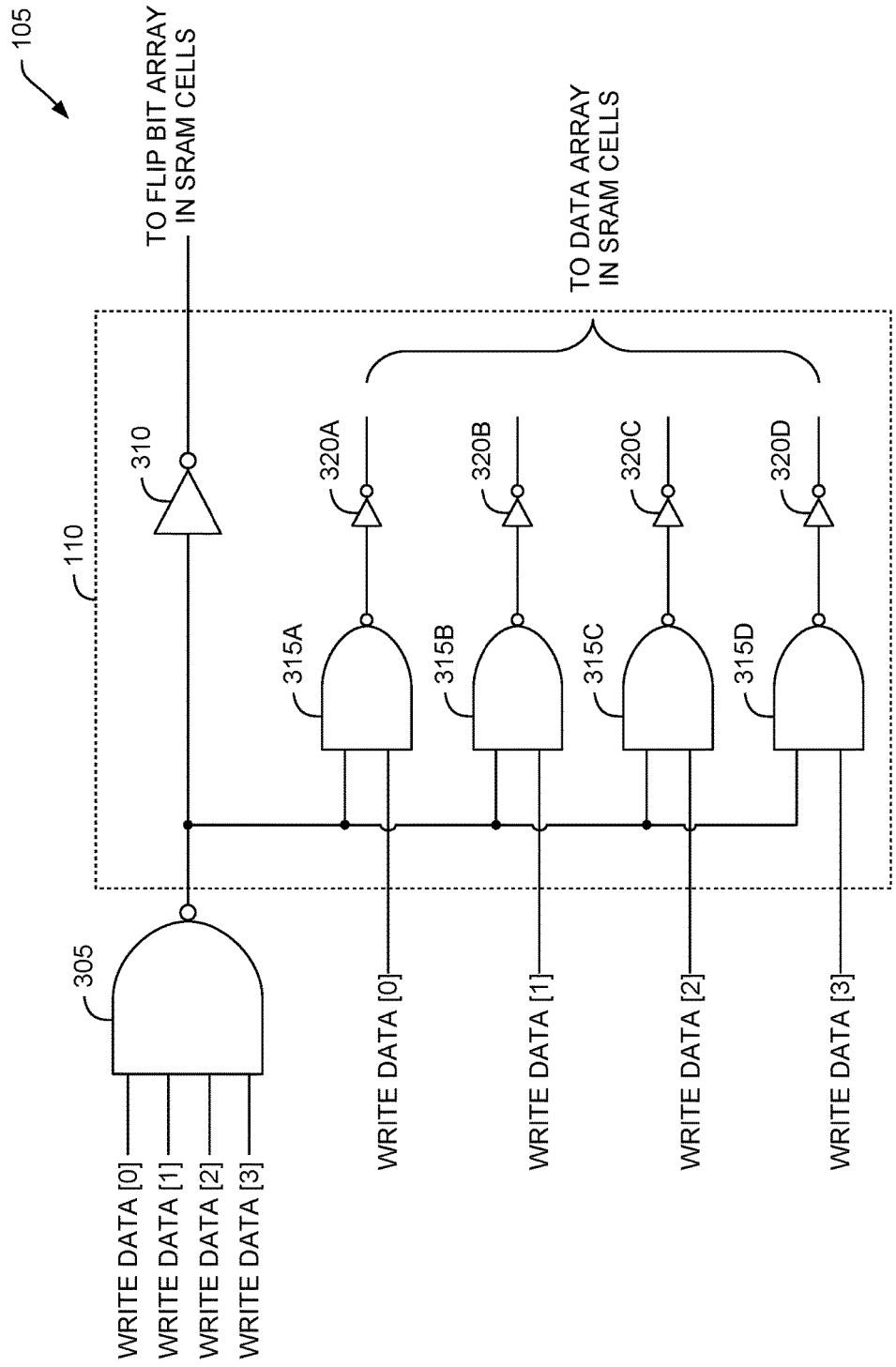
FIG. 3 is a circuit for selectively flipping a received data chunk in a SRAM, according to one embodiment described herein.

At block 205, the data driver 105 receives data to be stored in the SRAM cells. As shown in FIG. 3, the driver 105 includes a NAND gate 305 which receives the four bits of a data chunk (i.e., write data [0-3]) of the received data. In one embodiment, the data driver 105 includes multiple copies of the circuitry shown in FIG. 3. As such, the data driver 105 can process multiple data chunks in parallel. For example, if the data driver 105 includes sixteen copies of the circuitry shown in FIG. 3, the driver 105 can process sixteen data chunks in parallel.

At block 210, the data driver 105 evaluates each predefined chunk of received data to determine if all the bits in the chunk are in the high power state—i.e., a logical one. The NAND gate 305 outputs a logical zero only if all four of the write data values are a logical ones (i.e., the high power state). Otherwise, if any one of the four write data values is a logical zero, the NAND gate 305 outputs a logical one. The output of the NAND gate 305 is inputted into an inverter 310 which outputs the flip bit corresponding to the current data chunk being evaluated—i.e., write data [0-3]. Thus, the flip bit is only a logical one if all the bits of the write data [0-3] are logical ones.

Assuming the bits of write data [0-3] are random, the flip bit will most likely be a logical zero. As such, adding the inverter 310 ensures that the flip bit stored in the SRAM is only in the high power state—i.e., a logical one—when all the bits of the data chunk are logical ones, which is less likely to occur than at least one of the bits being a logical zero. Thus, for most situations, the flip bit is a logical zero which means the SRAM saves power when reading out the stored flip bit. Of course, if a logical zero was the high power state in the SRAM rather the logical one, than the inverter 310 would be omitted from the data driver 105 and the direct output of the NAND gate 305 could be used as the flip bit.

At block 215, the data driver 105 determines if all the bits in the data chunk are in the high power state (i.e., logical ones). If not, the method 200 proceeds to block 220 where the data driver 105 outputs a flip bit in the low power state—i.e., a logical zero—which is stored in a SRAM cell of a flip bit memory array. The logical zero value for the flip bit indicates that the bits of the corresponding data chunk were not flipped when stored in the SRAM cells. At block 225, the data driver 105 outputs the bits in the chunk in their received states. Put differently, the data driver 105 does not flip the states of the write data bits [0-3]. As shown in FIG. 3, the driver 105 includes four NAND gates 315A-D which are each coupled to the output of NAND gate 305 and a respective one of the bits in the data chunk. If the output of the NAND gate 305 is a logical one (indicating at least one of the bits is a logical zero), the outputs of each of the NAND gates 315A-D changes depending on the value of the respective write data bits. For example, if write data [0] is a logical one, the output of the NAND gate 315A is a logical zero. If the write data [0] is a logical zero, the output of the NAND gates 315A is a logical one. The same applies for the other write data bits [1-3]. The outputs of the NAND gates 315A-D are then inverted using inverters 320A-D so that the values of the write data [0-3] are returned to their received (i.e., original) states. In this manner, when all of the bits in the data chunk are not logical ones, the data driver 105 stores the bits in the data chunk in its received (i.e., original) state into the SRAM.

However, if at block 215 the data driver 105 determines all the bits in the data chunk are logical ones, the method 200 proceeds to block 230 where the data driver 105 outputs a flip bit in a high power state—i.e., logical one—indicating that all the bits in the data chunk were flipped before being stored in the SRAM. At block 235, the data driver 105 uses the NAND gates 315A-D and inverters 320A-D to flip the values of write data [0-3] from logical ones to logical zeros. Specifically, because the output of NAND gate 305 is a logical zero when all the bits of write data [0-3] are logical ones, all of the NAND gates 315A-D output a logical one. The inverters 320A-D then flip the logical ones to logical zeros which are then stored into the SRAM.

One advantage of the circuit shown in FIG. 3 is that it introduces very little overhead into the SRAM. Put differently, the amount of logic used to determine if all the bits in a data chunk are in a high power state and flip the bits is much less than a technique where the data driver determines if, for example, the majority of the bits or some percentage of the bits (e.g., 80%) are in the high power state and then flipping the bits.

Figure 4:
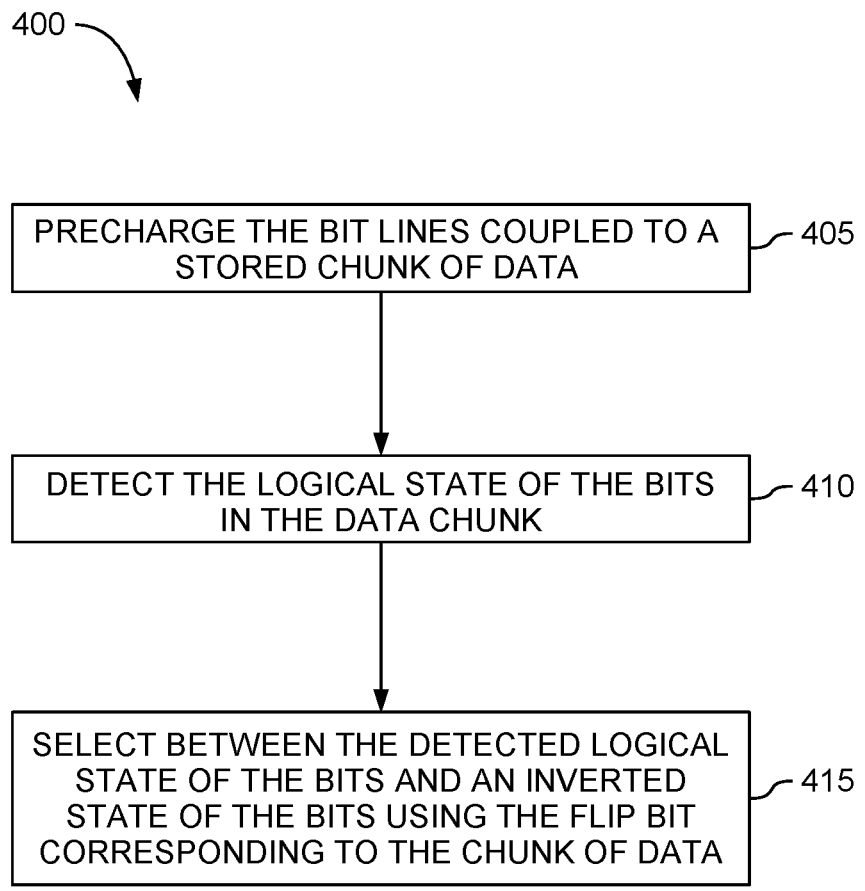
FIG. 4 is a flowchart for selectively flipping bits read out from a SRAM, according to one embodiment described herein.

FIG. 4 is a flowchart of a method 400 for selectively flipping bits read out from a SRAM, according to one embodiment described herein. For clarity, the different blocks of method 400 are described in parallel with FIG. 5 which is a circuit of the readout circuitry 130 for selectively flipping a data chunk read out from a SRAM, according to one embodiment described herein.

Figure 5:
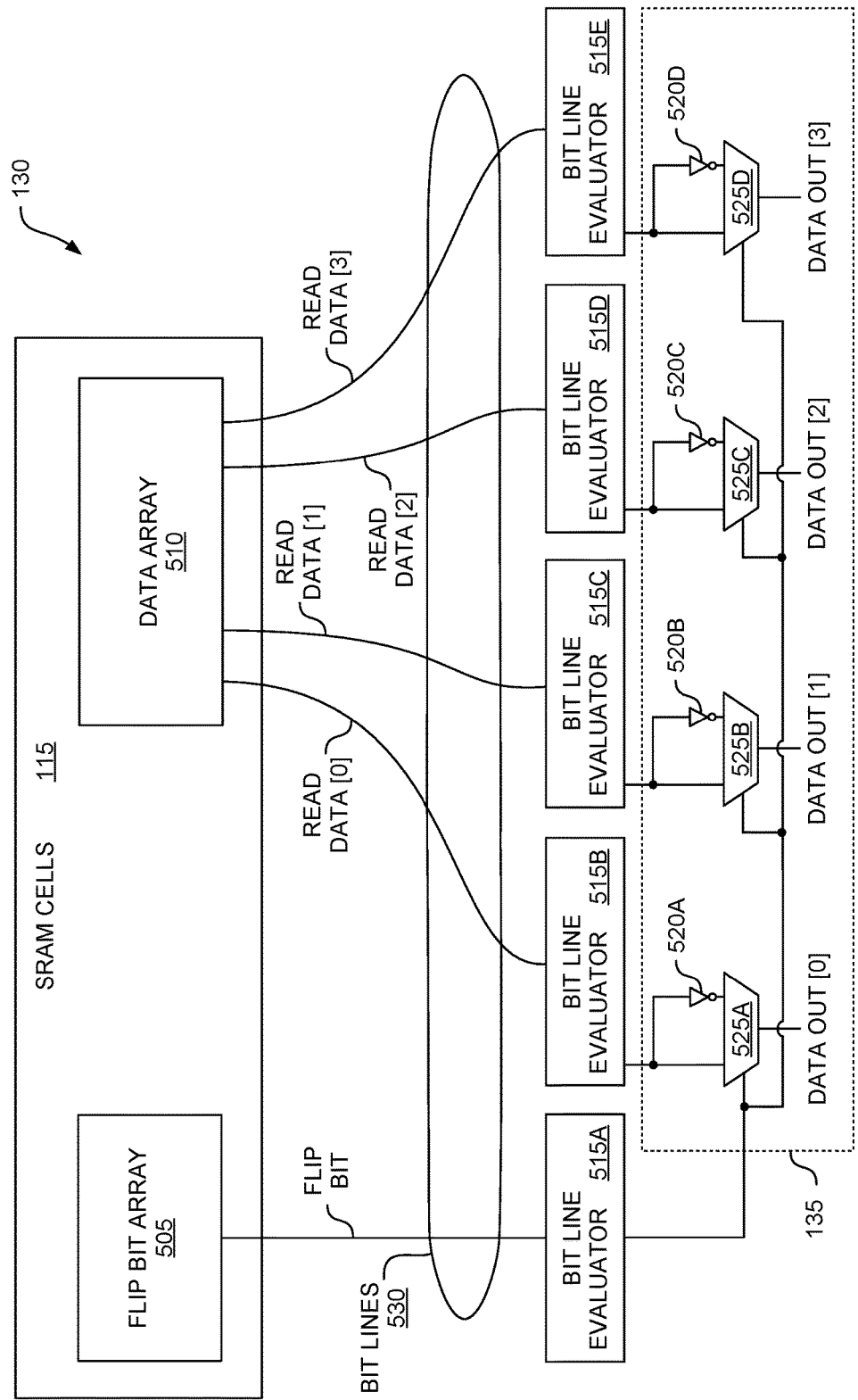
FIG. 5 is a circuit for selectively flipping a data chunk read out from a SRAM, according to one embodiment described herein.

At block 405, the readout circuitry 130 pre-charges bit lines 530 coupled to a stored chunk of data. As described above, the bit lines 530 may include local and global bit lines that are used to read data from different addresses or cells 115 in the SRAM. As shown in FIG. 5, the bit lines 530 are coupled to a flip bit array 505 which stores flip bits corresponding to respective data chunks stored in a data array 510. To read the data stored in the flip bit array 505 and the data array 510, the readout circuitry 130 pre-charges the bit lines 530 using the bit line evaluators 515. When reading out a logical zero, the pre-charge voltage on the bit lines 530 does not change, or at least changes less than if a logical one is read from the cells 115. Thus, when reading out a subsequent bit using the same bit lines 530 after reading a logical one, the bit line evaluators 515 draw more power in order to charge the bit lines 530 to the pre-charge voltage relative to reading out a logical zero.

At block 410, the bit line evaluators 515B-E detect the logical state of the bits in the data chunk—i.e., read data [0-3]. Because the readout circuitry 130 includes a separate bit line 530 for receiving bits from the flip bit array 505, the circuitry 130 can read out the flip bit corresponding to the data chunk at the same time or in parallel with reading out read data [0-3]. In other embodiments, however, the flip bit may be read out at a different time than the bits in the corresponding data chunk.

At block 415, the bit corrector logic 135 selects between the detected logical state of the bits and an inverted state of the bits using the flip bit corresponding to the data chunk. As shown in FIG. 5, the bit corrector logic 135 includes inverters 520 coupled to an output of a respective one of the bit line evaluators 515B-E. The outputs of the inverters 520 and the bit line evaluators 515B-E are fed into multiplexers 525. As such, the two inputs of the multiplexers 525 are the stored values of the read data [0-3] and their inverted values. The output of bit line evaluator 515A—i.e., the flip bit corresponding to the data chunk—is used as a selection signal for each of the multiplexers 525. In this example, if the flip bit is a logical one (which indicates the values of the data chunk were flipped before being stored in the data array 510), the multiplexers 525 select the output of the inverters 520 as data out [0-3]. Put differently, the bit corrector logic 135 inverts the stored state of the read data [0-3] so that the data out [0-3] is in the original state of the data chunk—i.e., all logical ones.

Conversely, if the flip bit is a logical zero, the multiplexers 525 select the output of the bit line evaluators 515B-E as the data out [0-3] values. In this scenario, flip bit indicates the values of the data chunk were not flipped before being stored in the SRAM cells 115. Because the bits were not flipped, the direct outputs of the bit line evaluators 515B-E are used as the data out. Put differently, the values of the read out [0-3] are used as the values of the data out [0-3]. The readout circuitry 130 then forwards the data out [0-3] of the data chunk to the requesting entity. In one embodiment, the data out [0-3] may be combined with other data chunks in a buffer which are then sent to a requesting entity such as a processor or memory managing unit.

In one embodiment, the SRAM may include multiple copies of the readout circuitry 130 shown in FIG. 5 so that multiple data chunks can be read out from the SRAM cells 115 in parallel. For example, the SRAM may include four copies of the readout circuitry 130 so that four data chunks can be read from the cells 115 in parallel. The bits of the four data chunks can be combined and sent to the requesting entity as a combined data value—e.g., a two byte data word. For timing purposes, each flip bit array cell 505, bit line 530, and bit line evaluator 515A may be chosen to reside physically close to the data chunk that it controls. That is, although FIG. 5 illustrates all the flip bits being stored in the flip bit array, the flip bits may be distributed across the SRAM such that the flip bits are stored or located close to the data chuck that the flip bit represents.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment or an embodiment combining software (including firmware, resident software, microcode, etc.) and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:

1. A static random-access memory (SRAM), comprising:
a data driver configured to:
   generate a flip bit indicating whether a plurality of bits in a received data chunk are in a high power state,
   upon determining the plurality of bits are in the high power state, store the flip bit in the SRAM in a first state and flip the plurality of bits before storing the plurality of bits in the SRAM, and
   upon determining at least one of the plurality of bits is in a low power state, store the flip bit in the SRAM in a second state different from the first state and store the plurality of bits in the SRAM without flipping any of the plurality of bits.

2. The SRAM of claim 1, the data driver comprising:
a NAND gate configured to receive the plurality of bits and output a signal indicating whether all of the plurality of bits are in the high power state.

3. The SRAM of claim 2, the data driver comprising:
an inverter coupled to the output of the NAND gate, the inverter configured to output the flip bit in the first state if all the plurality of bits are in the high power state and output the flip bit in the second state if at least one of the plurality of bits is in the low power state, wherein the first state corresponds to the high power state and the second state corresponds to the low power state.

4. The SRAM of claim 2, the data driver comprising:
a plurality of NAND gates, wherein each of the plurality of NAND gates is configured to receive the signal of the NAND gate and a respective one of the plurality of bits.

5. The SRAM of claim 4, the data driver comprising:
a plurality of inverters each coupled to a respective output of one of the plurality of NAND gates, wherein outputs of the plurality of inverters are flipped relative to the plurality of bits if all of the plurality of bits are in the high power state.

6. The SRAM of claim 1, wherein a stored bit in the SRAM that is in the high power state requires more power to read out than when the stored bit is in the low power state.

7. The SRAM of claim 1, further comprising:
readout circuitry configured to:
   retrieve stored data corresponding to the received data chunk,
   retrieve the flip bit,
   upon determining the flip bit is in the first state, flipping each bit of the stored data before transmitting the stored data to a requesting entity, and
   upon determining the flip bit is in the second state, transmitting the stored data to the requesting entity without flipping any bits of the stored data.

8. An integrated circuit, comprising:
a data driver for a SRAM configured to:
   generate a flip bit indicating whether a plurality of bits in a received data chunk are in a high power state,
   upon determining the plurality of bits are in the high power state, store the flip bit in the SRAM in a first state and flip the plurality of bits before storing the plurality of bits in the SRAM, and
   upon determining at least one of the plurality of bits is in a low power state, store the flip bit in the SRAM in a second state different from the first state and store the plurality of bits in the SRAM without flipping any of the plurality of bits.

9. The integrated circuit of claim 8, the data driver comprising:

a NAND gate configured to receive the plurality of bits and output a signal indicating whether all of the plurality of bits are in the high power state.

10. The integrated circuit of claim 9, the data driver comprising:
an inverter coupled to the output of the NAND gate, the inverter configured to output the flip bit in the first state if all the plurality of bits are in the high power state and output the flip bit in the second state if at least one of the plurality of bits is in the low power state, wherein the first state corresponds to the high power state and the second state corresponds to the low power state.

11. The integrated circuit of claim 9, the data driver comprising:
a plurality of NAND gates, wherein each of the plurality of NAND gates is configured to receive the signal of the NAND gate and a respective one of the plurality of bits.

12. The integrated circuit of claim 11, the data driver comprising:
a plurality of inverters each coupled to a respective output of one of the plurality of NAND gates, wherein outputs of the plurality of inverters are flipped relative to the plurality of bits if all of the plurality of bits are in the high power state.

13. The integrated circuit of claim 8, wherein a stored bit in the SRAM that is in the high power state requires more power to read out than when the stored bit is in the low power state.

14. The integrated circuit of claim 8, further comprising:
readout circuitry configured to:
retrieve stored data corresponding to the received data chunk,
retrieve the flip bit,
upon determining the flip bit is in the first state, flipping each bit of the stored data before transmitting the stored data to a requesting entity, and
upon determining the flip bit is in the second state, transmitting the stored data to the requesting entity without flipping any bits of the stored data.

15. A method for operating an SRAM, comprising:
generating a first flip bit indicating whether a first plurality of bits in a first received data chunk are in a high power state;
upon determining the first plurality of bits are in the high power state:
storing the first flip bit in the SRAM in a first state, and
flipping the first plurality of bits before storing the first plurality of bits in the SRAM;
generating a second flip bit indicating whether a second plurality of bits in a second received data chunk are in the high power state; and
upon determining at least one of the second plurality of bits is in a low power state:
storing the second flip bit in the SRAM in a second state different from the first state, and
storing the second plurality of bits in the SRAM without flipping any of the second plurality of bits.

16. The method of claim 15, further comprising:
receive the first plurality of bits at a NAND gate that outputs a signal indicating whether all of the plurality of bits are in the high power state.

17. The method of claim 16, further comprising:
receiving the output signal of the NAND gate at an inverter that outputs the first flip bit and the second flip bit.

18. The method of claim 16, further comprising:
receiving the output signal of the NAND gate and a respective one of the first plurality of bits at a plurality of NAND gates.

19. The method of claim 15, wherein a stored bit in the SRAM that is in the high power state requires more power to read out than when the stored bit is in the low power state.

20. The method of claim 15, further comprising:
retrieving stored data corresponding to the first received data chunk;
retrieving the first flip bit; and
upon determining the first flip bit is in the first state, flipping each bit of the stored data before transmitting the stored data to a requesting entity.

* * * * *